United States Patent
Ning

(10) Patent No.: US 6,654,187 B2
(45) Date of Patent: Nov. 25, 2003

(54) CAMERA LENS CARRIER FOR CIRCUIT BOARD MOUNTING

(76) Inventor: Alex Ning, P.O. Box 131672, Carlsbad, CA (US) 92013

( * ) Notice: Subject to any disclaimer, the term of this patent is extended or adjusted under 35 U.S.C. 154(b) by 47 days.

(21) Appl. No.: 09/906,871

(22) Filed: Jul. 16, 2001

(65) Prior Publication Data

US 2003/0011903 A1 Jan. 16, 2003

(51) Int. Cl.[7] .................................................. G02B 7/02
(52) U.S. Cl. ........................ 359/823; 359/819; 359/822
(58) Field of Search ................................ 359/819, 822, 359/823

(56) References Cited

U.S. PATENT DOCUMENTS 5,502,598 A * 3/1996 Kimura et al. .............. 359/814
6,222,995 B1 * 4/2001 Uchida ........................... 396/6
6,483,101 B1 * 11/2002 Webster ....................... 250/216

* cited by examiner

*Primary Examiner*—Jordan M. Schwartz
*Assistant Examiner*—Jessica Stultz
(74) *Attorney, Agent, or Firm*—Donn K. Harms

(57) ABSTRACT

A lens carrier for operative engagement of a camera lens with an image sensor such as a Charge Coupled Device or CMOS device. The lens mounts in a lens barrel on the lens carrier and may be laterally translated along the lens barrel to focus the image projected by the lens on an adjacent image sensor. The lens carrier also provides for self centering of the center axis of the lens with the center point on the imaging surface of the image sensor and for a perpendicular alignment of the lens center axis with the imaging surface to achieve the best conversion of the visual image from the lens into analog or digital format for use by electric devices.

19 Claims, 2 Drawing Sheets

CAMERA LENS CARRIER FOR CIRCUIT BOARD MOUNTING

FIELD OF THE INVENTION

The disclosed device relates to digital cameras. More particularly, it relates to a device to provide cooperative operative engagement of the lens of a digital camera with the computer chip which digitizes the image communicated from the lens.

BACKGROUND OF THE INVENTION

Conventional photography and film use a lens which focuses the light received through the lens on film which chemically reacts to the light and chemicals used later to produce an image on the film. That image can be converted to a photograph using conventional photo printing methods and the camera produced film negative. The key difference between a digital camera and a film-based camera is that the digital camera has no film. Instead, it has an electronic image sensor that converts light projected upon the image sensor into electrical charges. The ability to produce electronic or printed pictures from photos stored on digital cameras is a direct result of this shift from recording an image on film to recording the image in digital form using the image sensor to take the projected image from a conventional lens and convert it to computer useable format.

The image sensor employed by most digital cameras is a charge coupled device (CCD). Some low-end cameras use complementary metal oxide semiconductor (CMOS) technology. However, the majority of digital cameras employ a CCD as the image sensor to convert the visible image from the lens to a digitized electronic image that may be stored in a computer memory and printed in a variety of fashions.

The CCD is a collection of tiny light-sensitive diodes, which convert photons (light) into electrons (electrical charge). These diodes are called photosites. Each photosite is sensitive to light focused on the CCD surface by the lens and the brighter the light that hits a single photosite, the greater the electrical charge that will accumulate at that site on the photosite on the CCD surface. Consequently, a digital camera is similar to a film camera except that the film is replaced with an electronic image sensor in the form of the CCD.

The electrons produced by the light that hits the individual photosites on the CCD are stored in small capacitors which are read out as a series of voltages which are proportional to the image brightness. This series of rising and falling voltages is then converted to a number by an analog to digital converter and the series numbers are stored and processed by a computer within the camera or communicating with the camera to form the digital or electronic image.

In many designs, a mechanical shutter in the lens field of view is used in the same way that it is used in a film camera—to gate the light that is allowed to reach the CCD. Other cameras use what is called an electronic shutter which allows the control of when the CCD gathers light through electronic control of signals to and from the CCD.

As such, the quality of the light focused by the lens, on the image sensor, whether it be a CCD or CMOS, is of utmost importance to the eventual quality of the digital image produced by the image sensor and stored on the computer or in the camera. It is thus imperative that the light communicated through the lens reach the image sensor at substantially the center point and that the lens axis be substantially perpendicular to the imaging surface of the image sensor. An angle in the lens axis in relation to the image sensing surface will produce unfocused images with one half of the image in focus and the other out of focus. Also, if the center axis of the lens does not substantially line up with the center point of the image sensing surface, the resulting digital image transmitted by the image sensor will be off center, have darker corners or edge portions, and of inferior quality.

Currently, lenses used on digital cameras are placed in lens holders that mate to positions on a circuit board which also mounts the image sensor. The conventional lens holders are affixed in communication with the circuit board using fasteners such as screws and during this fastening process a centering of the lens axis over the center point of the imaging surface of the image sensor is either not controlled, attempted by hand, or estimated using the screw mounting to the circuit board. Unfortunately, due to the tolerances in the mounting of the image sensor and the plurality of planes it can fall into in its attachment to the circuit board, combined with the additional tolerances of mounting the lens holder to a physical mounting on the circuit board around or adjacent to the image sensor and at potentially different planes, it is extremely hard to place the center axis of the lensholder-mounted lens, centered on the center point of the imaging surface and also perpendicular to that surface. Consequently, much hand adjustment by persons mounting the lens to the board is required and many assembled components fail to produce an adequate digital image due to misalignment caused by the multiple tolerances in lens attachment to the board and image sensor attachment to the same circuit board.

As such, there is a pressing need for a device which will cooperatively engage the lens used with a digital camera and operatively mount that lens with its center axis lined up with the center point of the imaging surface on the image sensor. Such a device should also maintain the lens center axis substantially perpendicular to the imaging surface of the image sensor and also provide a means to adjust the distance between the projection end of the lens and that imaging surface for focus of the projected image on the imaging surface. Still further, such a device should allow for easy attachment of the lens to the image sensor instead of the circuit board with little or no need for adjustment during manufacture.

SUMMARY OF THE INVENTION

The above problems, and others are overcome by the herein disclosed and described lens carrier for cooperative operative engagement with the image sensor such as a CCD or CMOS device, or a chip carrier holding the image sensor to a circuit board surface.

The camera lens carrier herein described and disclosed features a base having a barrel having an axial channel therethrough attached to the base and communicating therethrough. The lens barrel is configured to cooperatively engage the exterior of a camera lens. The cooperative engagement allows for a threaded or other laterally translatable adjustment of the distance inside the barrel in which the lens protrudes and therefor the distance that the projection end of the lens is mounted above the base.

The center axis of the barrel is also positioned to line up substantially with the center point on the imaging surface of the image sensor to be used in combination herewith. Consequently, the image projected by the lens is centered on the imaging surface once the lens carrier is cooperatively engaged with the image sensor or the chip carrier holding the image sensor used in combination herewith.

The bottom surface of the base is configured for cooperative engagement with the edge of the image sensor used to capture the lens-projected image. This edge in generally substantially parallel to the imaging surface of the image sensor itself and therefor a cooperative engagement with the edge will yield a parallel engagement of the base with the imaging surface. Since the base is perpendicular to the lens barrel, the lens when cooperatively engaged in the lens barrel with the base cooperatively engaged with the edge of the image sensor will place the lens center axis lined up with the center point of the imaging surface and perpendicular to the imaging surface to yield optimum optical clarity. This cooperative engagement of the base of the lens carrier thereby yields a means for perpendicular alignment of the lens axis with the imaging surface of the image sensor.

A means to focus the image projected by the lens on the imaging surface is provided by the cooperative laterally adjustable engagement of the lens barrel with the lens and the ability of that cooperative engagement to adjust the distance between the projection end of the lens and that imaging surface thereby providing easy attachment of the lens to the image sensor instead of the circuit board with little or no need for adjustment during manufacture.

Accordingly, it is the object of this invention claimed herein to provide a simplified means of attachment of optical lenses to electronic image sensors such as CCD's and CMOS devices.

It is another object of this invention to provide such a means of attachment of the optical lens which also centers the axis of the lens to the center point of the imaging surface of the image sensor.

It is still another object of this invention to provide a component for attachment of lenses to electronic image sensors that cooperatively engage with the image sensor thereby alleviating the need for screws and adhesives.

It is a still further object of this invention to provide such a lens attachment to image sensors that aligns the center axis of the lens perpendicular to the plane of the imaging surface of the image sensor.

It is yet another object of this invention to provide such a component for attaching a lens to an electronic image sensor which provides a means to easily focus the image projected by the lens on the image sensor imaging surface.

Further objectives of this invention will be brought out in the following part of the specification, wherein detailed description is for the purpose of fully disclosing the invention without placing limitations thereon.

BRIEF DESCRIPTION OF THE DRAWING FIGURES

The accompanying drawings which are incorporated in and form a part of this specification illustrate embodiments of the disclosed processing system and together with the description, serve to explain the principles of the invention.

DETAILED DESCRIPTION OF THE PREFERRED EMBODIMENTS

Figure 1:
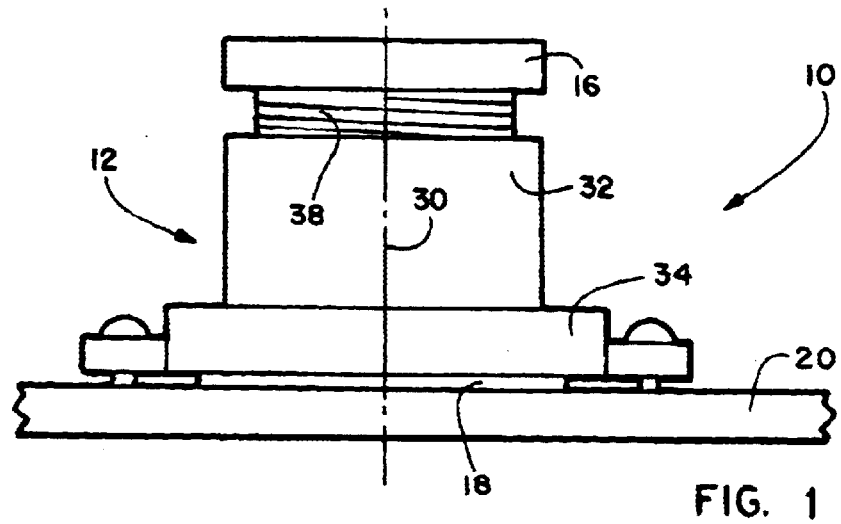
FIG. 1 depicts a side view of the lens carrier operatively mounted in cooperative registered engagement with the electronic image sensor mounted on a conventional circuit board.
Figure 2:
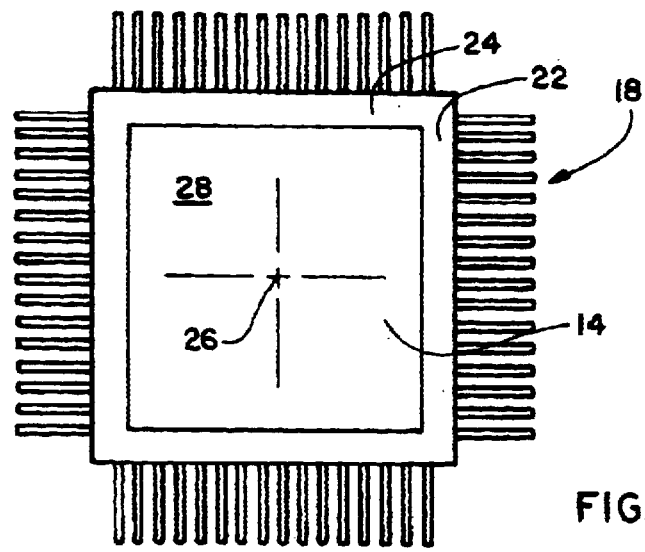
FIG. 2 depicts a top view of a conventional Charge Coupled Device that is used to convert images projected from a lens to digital format.

Referring now to FIG. 1 depicts a side view of the disclosed device 10 showing the lens carrier 12 operatively mounted to an image sensor 14 such as a charge coupled device or CMOS device used to convert projected images from a lens 16 to be communicated in analog or digital format to a computer or electronic camera or similar device for displaying digital pictures.

Currently, the image sensor 14 is mounted in a conventional chip carrier 18 designed to engage such image sensors 14 on a circuit board 20. Generally the perimeter of the image sensor 14 has electrical contacts which engage with mating electrical contacts on the chip carrier 18 which is operatively attached to the circuits of the circuit board. The chip carrier 18 has a substantially flat ledge 22 about the perimeter of a top surface 24 of the chip carrier 18 and a detent inside the ledge 22 where the image sensor 14 is engaged. The image sensor 14 conventionally has a planar imaging surface 28 on which the picture projected by the lens 16 is projected. It is highly desirable that the lens center axis which is substantially the same as the barrel center axis 30 substantially line up with the center point 26 of the imaging surface 28 so that the image from the lens properly registers in the imaging surface 28 for electronic transmission to the electronic device attached. Any misalignment will cause the resulting digital picture to be inferior and off center. It is also highly desirable to align the barrel center axis 30 substantially perpendicular to the surface of the imaging surface 28 to yield optimum picture quality.

A lens barrel 32 is attached perpendicular to the base 34 and has an axial passage 36 running the length of the lens barrel 32 and communicating through the base 34. Operative engagement of the lens 16 with the lens barrel 32 is best achieved using a system of cooperative engagement that provides for SAID PRODUCTS translation of the lens 16 in the barrel. Such SAID PRODUCTS translation provides a means to focus the image projected on the imaging surface 28 by the lens 16 by moving the projection end toward or away from the imaging surface 28. In the current best mode threads 38 on the circumference of the lens 16 engage with threads on the interior wall 40 of the lens barrel 32. Twisting the lens 16 will as such, screw it toward or away from the imaging surface 28 when the lens carrier 12 is operatively engaged with the image sensor 14. While mating threads are the current best mode, other means of lateral or axial translation of the lens 16 in the lens barrel 32 could be used such as a lens barrel 32 that is slotted and matching notch on the lens 16 or simply frictional engagement of the exterior of the lens 16 with the interior wall 40 of the lens barrel 32 and such other means of SAID PRODUCTS translation are anticipated.

The lens carrier 12 is designed to engage the lens 16 in the lens barrel 32 and project the image from the lens 16 onto the operatively attached image sensor 14. As noted above, the barrel center axis 30 should optimally line up with the center point 26 of the imaging surface 28 and concurrently be perpendicular thereto. A means of alignment of the barrel center axis 30 with the center point 26 is provided by a recess 42 formed in the bottom surface 44 of the base 34. The recess 42 is cut into the bottom surface 44 and is positioned and dimensioned to cooperatively engage the perimeter edge of the chip carrier 18 holding the image sensor 14 or the perimeter of the image sensor 14 itself should it not have a chip carrier 18, and, to register the barrel center axis 30 directly over the center point 26 of the imaging surface 28. This embodiment of a means of alignment of the barrel center axis 30 with the center point 26 works best if the chip carrier 18 is manufactured with a shaped perimeter edge or shoulder designed to cooperatively engage the recess 42 in the bottom surface 44 of the lens carrier 12. Consequently this matched set of a chip carrier 18 and lens carrier 12 designed to cooperatively engage and center the barrel center axis 30 over the center point 26 is anticipated.

Using either means of alignment of the barrel center axis with the center point 26 the image projected from the lens 16 which communicates through the lens barrel 32 and through the base 34 is substantially centered on the imaging surface 28 of the image sensor 14 by simply placing the recess 42 formed in the lens carrier 12 in over the chip carrier 18 or image sensor 14 if no chip carrier is used, engaging the two. The recess 42 will encircle a cooperatively shaped perimeter of the chip carrier 18 or image sensor 14 and hold the barrel center axis 30 centered.

A means for perpendicular alignment of the barrel center axis 30 with the imaging surface 28 of the image sensor 14 is provided by engagement of the recess 42 with a top surface of the chip carrier 18 or the image sensor 14. The top wall 45 is cut substantially flat and perpendicular to the barrel center axis 30 and consequently the lens center axis when the lens 16 cooperatively engaged in the lens barrel 32. In this fashion, when the recess 42 is placed over the image sensor 14, the flat ledge 22 on the chip carrier 18 or on the image sensor 14 itself in some cases, mates with the flat top wall 45 holding the lens carrier 12 slightly above the surface of the adjacent circuit board 20. Since the ledge 22 is substantially parallel to the imaging surface 28 when it supports the lens carrier 12 on the top wall 45 the barrel center axis 30 is positioned perpendicular to the imaging surface 28. Optionally, the recess 42 might have steps 46 formed therein rising from the top wall 45 to allow for easy mating of the lens carrier 12 to different ledges 22 either on the image sensor 14 itself or formed on the chip carrier 18 mounting adjacent to and parallel with, the imaging surface 28. Since the steps 46 would hold the mounted lens carrier 12 substantially flat, the barrel center axis 30 is positioned perpendicular to the imaging surface 28 and as is shown, the lens axis would also be perpendicular to the imaging surface 28 when mounted in the lens barrel 32 of the device 10. A simple machining of the steps 46 rendering their bottom surface perpendicular to the barrel axis 30, instead of the entire top wall 45 would be all that would be required to adjust the positioning. Also the steps 46 require much less machining to make for a flat engagement of the ledge 22 and the surface of the steps 46 with the lens carrier 12 thereby held slightly elevated above the circuit board 20. Another option provided would be a second recess 43 formed in the top wall 45 and sized to accommodate a filter mounting therein. This second recess 43 would provide a mount for a filter should it be required.

Figure 4:
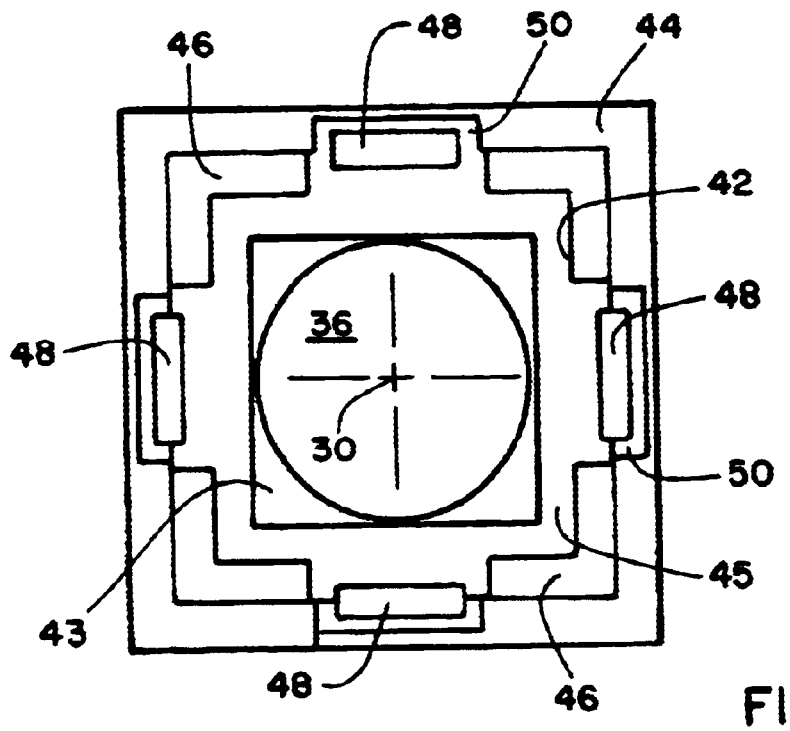
FIG. 4 depicts the underside of a preferred embodiment of the lens carrier showing stepped edges for registered engagement with a side edge of a chip carrier or the image sensor showing a plurality of biased clips for engagement therewith.
Figure 5:
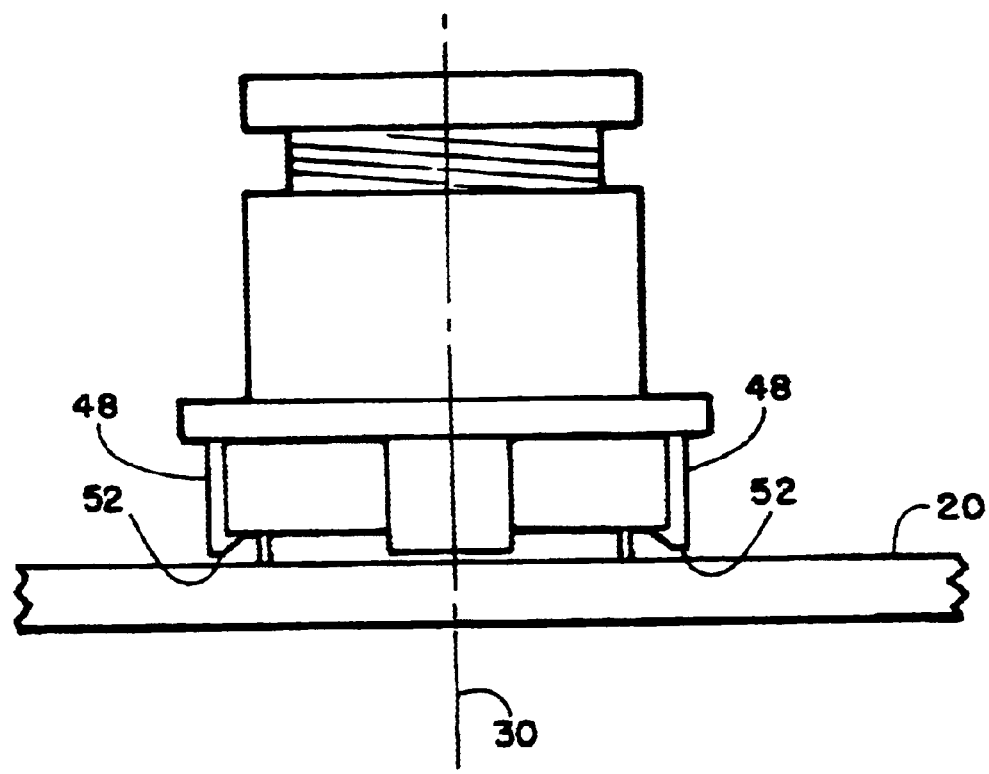
FIG. 5 depicts a section through FIG. 4 showing the cooperative engagement of the biased clips with the side edge of the chip carrier and resulting biased self centering of the lens over the center of the chip carrier.

Also shown in FIG. 4 are a means for self centering of the barrel center axis 30 and when mounted, over the center point 26 in the form of mounting clips 48. There are four mounting clips 48 positioned in opposite pairs in notches 50 in the perimeter of the recess 42. The clips 48 are flexible are formed in the recess 42 of the base 34 in positions to allow them to tilt into the notches 50 when forced by the perimeter edge of the chip carrier 18 or exterior of the image sensor 14 when no chip carrier 18 is used. The clips are formed such that they require a substantially equal force to deflect them away from the center point 26 when mounted and toward the recess 42 if included. The distal end of the clips 48 have a projection 54 formed thereon as a means to cooperatively engage with the side of the chip carrier 18 or the bottom of the chip carrier 18. If the image sensor 14 is mounted without a chip carrier 18 then the projection 54 would engage directly with the side or bottom thereof. Of course a groove might be cut into the side of the chip carrier 18 or the image sensor 14 for better cooperative engagement with the projection 54 or other types of cooperative engaging shapes might be used and such are anticipated.

In use, the lens carrier 12 would be slid upon the chip carrier 18 or image sensor 14 with the recess 42 operatively engage around the perimeter thereof. A downward force on the lens carrier 12 causes the clips 48 to flex away from the center point 26 with equal force and toward the notches 50 and then rebound toward the barrel center axis 30 when the distal end 52 of the clip 48 would engage the side or bottom edge of the chip carrier 18 or image sensor 14. Because it takes a substantially equal amount of force to flex the clips 48, and because they are situated in opposite pairs or in an opposite pair for the minimum function, the force of the clips 48 naturally equalizes in both directions and self centers the lens barrel 32 and barrel center axis 30 and thus the lens center axis of a mounted lens 16 over the center point 26 while concurrently providing a means of cooperative engagement of the lens carrier 12 with the image sensor 14. This embodiment is especially practical and preferred in instances where high volumes of lenses 16 must be mounted to image sensors 14 because of the reduction in adjustments that must be made since the device 10 is self centered, with the barrel center axis 30 perpendicular to the imaging surface 28 and cooperatively engaged with the image sensor 14 or the chip carrier 18 holding the image sensor 14, all in one quick action.

Figure 3:
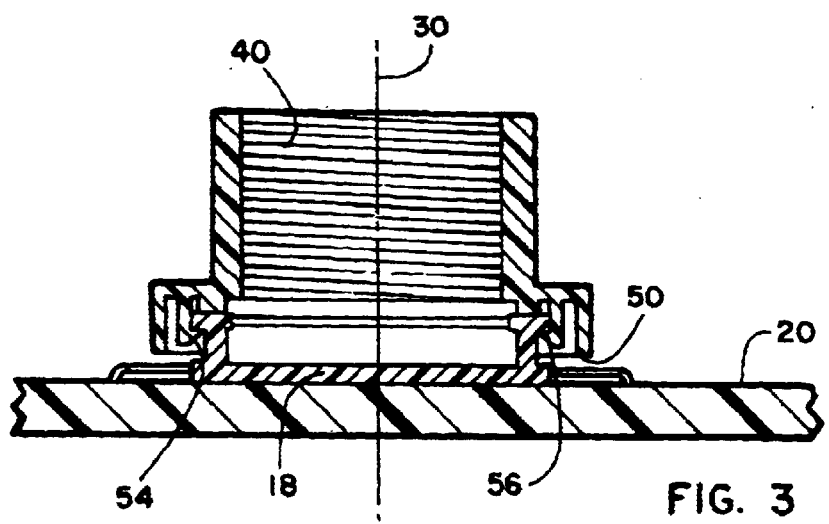
FIG. 3 depicts a side cut away view of disclosed lens carrier in another favored embodiment wherein operative engagement of the lens carrier with the imaging sensor is achieved by cooperative mating fasteners formed in the lens carrier and a chip carrier holding the image sensor to a circuit board.

Another preferred embodiment of the device 10 would have the lens carrier 12 and chip carrier 18 being made in a mating form designed to cooperatively engage with each other. As shown in FIG. 3 the lens carrier 12 could be made with clips 48 specifically dimensioned for the projections 54 to locate in grooves 56 formed in the side of the chip carrier 18 or just to engage the side of the chip carrier 18 in cooperative engagement. In this fashion chip carriers 18 could be manufactured in a kit having a plurality of differently configured chip carriers 18 configured to cooperatively engage with a variety of different image sensors 14 and thereafter engage with a variety of different mating lens carriers 12 which would easily mount in the aforementioned fashion. All of the chip carriers 18 would be designed to leave the lens carrier 12 slightly elevated above the circuit board 20 and to use the chip carrier 18 and lens carrier 12 cooperative mating as a mean of alignment of the lens carrier center axis 30 with the center point of the image sensor 14 and as a means of perpendicular alignment of the lens center axis with the imaging surface. This would be accomplished by the formation of a mating shoulder or ledge 22 on the chip carrier 18 matching the top wall 45 or steps 46 of the lens carrier 12 in the aforementioned fashion and the mounting clips 48 on the lens carrier 12 mating to the sides of the chip carrier 18 in the aforementioned fashion.

While all of the fundamental characteristics and features of the present invention has been described herein, with reference to particular embodiments thereof, a latitude of modification, various changes and substitutions are intended in the foregoing disclosure and it will be apparent that in some instances, some features of the invention will be employed without a corresponding use of other features without departing from the scope of the invention as set forth. It should be understood that such substitutions, modifications, and variations may be made by those skilled in the art without departing from the spirit or scope of the invention. Consequently, all such modifications and variations are included within the scope of the invention as defined by the following claims.

What is claimed is:

1. A lens carrier for use in combination with an electronic image sensor attached to an electronic circuit board, comprising;
   a lens carrier;
   said lens carrier having a base said base having a top surface and a bottom surface;
   an elongated lens barrel having an upper end and having a lower end attached to said base;
   said lens barrel having an axial passage communicating therethrough from said upper end through said bottom surface of said base;
   said axial passage having a center axis therethrough and an interior wall dimensioned for cooperative engagement with the exterior of a lens;
   means to focus the image projected by said lens when cooperatively engaged in said axial passage, upon an imaging surface located on an image sensor;
   means for cooperative engagement of said lens carrier with said image sensor with said center axis of said axial passage substantially perpendicular said imaging surface on said image sensor;
   said means for cooperative engagement of said lens carrier with said image sensor provided by a recess in said bottom surface of said base, said recess defined by a top wall and sidewalls;
   said top wall being substantially perpendicular to said center axis of said barrel; and
   said recess dimensioned to operationally engage the perimeter of said image sensor with said top wall positioned against a substantially flat ledge adjacent to at least two sides of said imaging surface.

2. The lens carrier as defined in claim 1 wherein said image sensor is one of a group of image sensors including a Charge Coupled Device and a CMOS device.

3. The lens carrier as defined in claim 1 additionally comprising:
   said imaging surface having a center point thereon; and
   means for alignment of said center axis of said barrel with said center point.

4. The lens carrier as defined in claim 1 additionally comprising: said imaging surface having a center point thereon; and means for alignment of said center axis of said barrel with said center point.

5. The lens carrier as defined in claim 4 wherein said means for alignment of said center axis of said barrel with said center point comprises:
   at least two flexible clips extending from said bottom surface of said base on opposite sides of said base, said flexible clips each requiring a substantially equal amount of force to deflect said clips;
   said clips having an attachment end attached to said base and a distal end; and
   means of cooperative engagement of said distal end of said clips with said image sensor, whereby said clips cooperatively engage said lens carrier with said image sensor and said clips deflect the center axis of said barrel substantially in line with said center point.

6. The lens carrier as defined in claim 5 additionally comprising:
   notches in said side walls adjacent to said clips; and
   said clips deflectable into said notches during mounting of said lens carrier to said image sensor.

7. The lens carrier as defined in claim 1 wherein said means to focus the image projected by said lens when cooperatively engaged in said axial passage, upon an imaging surface located on an image sensor comprises threads on the outside of said ions threadably engageable with threads on said interior wall of said axial passage.

8. The lens carrier as defined in claim 4 wherein said means to focus the image projected by said lens when cooperatively engaged in said axial passage, upon an imaging surface located on an image sensor comprises threads on the outside of said lens threadably engageable with threads on said interior wall of said axial passage.

9. The lens carrier as defined in claim 6 wherein said means to focus the image projected by said lens when cooperatively engaged in said axial passage, upon an imaging surface located on an image sensor comprises threads on the outside of said lens threadably engageable with threads on said interior wall of said axial passage.

10. A lens carrier for use in combination with an electronic image sensor attached to an electronic circuit board, comprising:
    a lens carrier;
    said lens carrier having a base said base having a top surface and a bottom surface;
    an elongated lens barrel having an upper end and having a lower end attached to said base;
    said lens barrel having an axial passage communicating therethrough from said upper end through said bottom surface of said base;
    said axial passage having a center axis therethrough and an interior wall dimensioned for cooperative engagement with the exterior of a lens;
    means to focus the image projected by said lens when cooperatively engaged in said axial passage, upon an imaging surface located on an image sensor;
    means for cooperative engagement of said lens carrier with said image sensor with said center axis of said axial passage substantially perpendicular said imaging surface on said image sensor;
    said image sensor is operatively mounted in a chip carrier which is mounted to a circuit board, said chip carrier having a carrier ledge thereon adjacent to said image sensor and substantially parallel to the imaging surface of said image sensor when said image sensor is mounted in said chip carrier;
    said means for cooperative engagement of said lens carrier with said image sensor defined by a recess in said bottom surface of said base, said recess defined by a top wall and sidewalls;

said top wall being substantially perpendicular to said center axis of said barrel; and said recess dimensioned to operationally engage the perimeter of said image sensor mounted in said chip carrier with said top wall positioned against said carrier ledge.

11. The lens carrier as defined in claim 10 additionally comprising:

said imaging surface having a center point thereon; and means for alignment of said center axis of said barrel with said center point.

12. The lens carrier as defined in claim 11 wherein said means for alignment of said center axis of said barrel with said center point comprises:

at least two flexible clips extending from said bottom surface of said base on opposite sides of said base, said flexible clips each requiring a substantially equal amount of force to deflect said clips;

said clips having an attachment end attached to said base and a distal end; and means of cooperative engagement of said distal end of said clips with said chip carrier whereby said clips cooperatively engage said lens carrier with said image sensor and said clips deflect the center axis of said barrel substantially in line with said center point.

13. The lens carrier as defined in claim 12 additionally comprising:

notches in said side walls adjacent to said clips; and said clips deflectable into said notches during mounting of said lens carrier to said image sensor.

14. The lens carrier as defined in claim 11 wherein said means to focus the image projected by said lens when cooperatively engaged in said axial passage, upon an imaging surface located on an image sensor comprises threads on the outside of said lens threadably engageable with threads on said interior wall of said axial passage.

15. The lens carrier as defined in claim 13 wherein said means to focus the image projected by said lens when cooperatively engaged in said axial passage, upon an imaging surface located on an image sensor comprises threads on the outside of said lens threadably engageable with threads on said interior wall of each axial passage.

16. A lens carrier assembly for use in combination with an electronic image sensor attached to an electronic circuit board, comprising a lens carrier;

said lens carrier having a base said base having a top surface and a bottom surface;

an elongated lens barrel having an upper end and having a lower end attached to said base;

said lens barrel having an axial passage communicating therethrough from said upper end through said bottom surface of said base;

said axial passage having a center axis therethrough and an interior wall dimensioned for cooperative engagement with the exterior of a lens;

a chip carrier having a mount for an image sensor thereon;

said lens carrier adapted for direct engagement upon said chip carrier;

said direct engagement between said chip carrier and said lens carrier thereby positioning said center axis of said axial passage substantially perpendicular to said imaging surface on said image sensor; and means to focus the image projected by said lens when cooperatively engaged in said axial passage, upon an imaging surface located on said image sensor.

17. The lens carrier assembly as defined in claim 16 additionally comprising:

said imaging surface having a center point thereon; and means for alignment of said center axis of said barrel with said center point.

18. The lens carrier assembly as defined in claim 17 wherein said means for alignment of said center axis of said barrel with said center point comprises:

at least two flexible clips extending from said bottom surface of said base on opposite sides of said base, said flexible clips each requiring a substantially equal amount of force to deflect said clips;

said clips having an attachment end attached to said base and a distal end; and means of cooperative engagement of said distal end of said clips with said chip carrier, whereby said clips cooperatively engage said chip carrier and also deflect the center axis of said barrel substantially in line with said center point.

19. The lens carrier as defined in claim 17 wherein said means for alignment of said center axis of said barrel with said center point comprises;

at least four flexible clips extending from said bottom surface of said base on four opposing side positions of said base, said flexible clips each requiring a substantially equal amount of force to deflect said clips;

said clips having an attachment end attached to said base and a distal end; and means of cooperative engagement of said distal end of said clips with one of said image sensor or said chip carrier; and said clips deflecting the center axis of said barrel substantially in line with said center point.

* * * * *